United States Patent
Furukawa et al.

(10) Patent No.: US 9,966,571 B2
(45) Date of Patent: May 8, 2018

(54) ORGANIC ELECTROLUMINESCENT LIGHTING DEVICE

(71) Applicants: NATIONAL UNIVERSITY CORPORATION YAMAGATA UNIV., Yamagata-shi, Yamagata (JP); DIC Corporation, Itabashi-ku, Tokyo (JP)

(72) Inventors: Tadahiro Furukawa, Yamagata (JP); Hideyuki Kobayashi, Yamagata (JP); Norifumi Kawamura, Yamagata (JP); Tomoko Okamoto, Sakura (JP); Yasuhiro Sente, Sakura (JP); Yoshinori Katayama, Sakura (JP)

(73) Assignees: NATIONAL UNIVERSITY CORPORATION YAMAGATA UNIVERSITY, Yamagata-Shi, Yamagata (JP); DIC CORPORATION, Itabashi-Ku, Tokyo (JP)

( * ) Notice: Subject to any disclaimer, the term of this patent is extended or adjusted under 35 U.S.C. 154(b) by 0 days. days.

(21) Appl. No.: 14/924,052

(22) Filed: Oct. 27, 2015

(65) Prior Publication Data

US 2016/0126502 A1 May 5, 2016

(30) Foreign Application Priority Data

Oct. 31, 2014 (JP) ................. 2014-222123

(51) Int. Cl.
*H01L 29/08* (2006.01)
*H01L 29/04* (2006.01)
(Continued)

(52) U.S. Cl.
CPC ...... *H01L 51/5268* (2013.01); *H01L 51/5212* (2013.01); *H01L 2251/301* (2013.01);
(Continued)

(58) Field of Classification Search
CPC ............ H01L 51/5268; H01L 51/5212; H01L 2251/301; H01L 2251/5361; H01L 2251/5392; H01L 2251/558
(Continued)

(56) References Cited

U.S. PATENT DOCUMENTS

2005/0051770 A1* 3/2005 Ando ................. H01L 27/1292 257/40
2006/0170111 A1* 8/2006 Isa ........................ H01L 21/288 257/775

(Continued)

FOREIGN PATENT DOCUMENTS

| JP | 2012-022878 A | 2/2012 |
|---|---|---|
| JP | 2012-069450 A | 4/2012 |
| WO | WO 2005/041217 A1 | 5/2005 |

*Primary Examiner* — Dzung Tran
(74) *Attorney, Agent, or Firm* — Buchanan, Ingersoll & Rooney PC

(57) ABSTRACT

Provided is an organic electroluminescent lighting device which can be seen that the entire surface is uniformly illuminated from the side of a transparent electrode substrate even when an auxiliary electrode or an auxiliary wiring is provided with respect to the transparent electrode substrate. In an organic electroluminescent lighting device including a pair of electrode layers including a translucent electrode layer provided on a translucent substrate, at least one organic layer interposed between the pair of electrode layers and including a light-emitting layer, and an auxiliary electrode provided on the translucent electrode layer such that the auxiliary electrode comes in contact with a portion of the translucent electrode layer, the auxiliary electrode includes conductive metal particles having a particle diameter of 0.1 to 2 μm, and is covered with an interlayer insulating coating film for suppressing the conduction with the organic layer.

6 Claims, 1 Drawing Sheet

(51) Int. Cl.
*H01L 27/14* (2006.01)
*H01L 51/52* (2006.01)

(52) U.S. Cl.
CPC ............... *H01L 2251/303* (2013.01); *H01L 2251/5361* (2013.01); *H01L 2251/5392* (2013.01); *H01L 2251/558* (2013.01)

(58) Field of Classification Search
USPC ............ 257/40, 59, 72, 98, E21.41; 136/263
See application file for complete search history.

(56) References Cited

U.S. PATENT DOCUMENTS

| | | | |
|---|---|---|---|
| 2007/0079869 A1 | 4/2007 | Yukinobu | |
| 2007/0137477 A1* | 6/2007 | Freeman | B01D 53/228 95/45 |
| 2008/0271843 A1* | 11/2008 | Yukinobu | H01G 9/2022 156/277 |
| 2011/0127494 A1* | 6/2011 | Huang | H01L 51/5048 257/40 |
| 2012/0055796 A1* | 3/2012 | Lee | B82Y 30/00 204/487 |
| 2012/0299050 A1* | 11/2012 | Lifka | H01L 51/441 257/99 |

\* cited by examiner

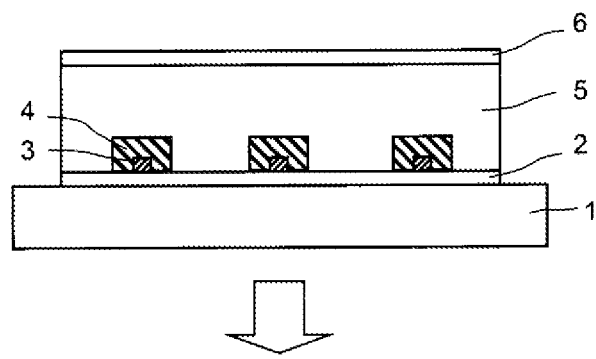

ORGANIC ELECTROLUMINESCENT LIGHTING DEVICE

BACKGROUND OF THE INVENTION

Technical Field

The present invention relates to an organic EL lighting device having an organic electroluminescent element (hereinafter, abbreviated as the organic EL element) as a light emission source.

Description of the Related Art

The commercialization of the organic EL lighting device as a planar light source, which is a thin film and can achieve light emission with high luminance by driving at a low voltage, is progressing.

When the light-emitting surface of the organic EL lighting is intended to be increased in area, the resistance value of a transparent electrode of ITO or the like which is generally used in the organic EL element is limited to be about $1.0 \times 10^{-4}$ Ω·cm, and it cannot be said that this value is sufficiently low. For this reason, when the distance between the transparent electrode and a power supply unit increases, an electric current is not sufficiently supplied thereto due to wiring resistance, and thus a problem arises in which luminance unevenness occurs.

In this regard, in order to decrease the resistance value of the transparent electrode, an auxiliary electrode or an auxiliary wiring made of a lower resistance material is provided on the transparent electrode or in the transparent electrode. In general, such an auxiliary electrode or an auxiliary wiring is formed by a metal, an alloy, or a stacked structure thereof (see JP 2012-69450 A and JP 2012-22878 A). For example, an electrode pattern of a stacked structure such as MAM (molybdenum-aluminum-molybdenum) is formed by photolithography.

Furthermore, an auxiliary electrode or the like is also attempted to be formed by a printing method, and, for example, WO 2005/041217 A describes that an auxiliary electrode is formed on a transparent electrode by screen printing and an organic layer such as an organic EL light-emitting layer is stacked on the auxiliary electrode.

However, in the organic EL element manufactured as described above, when the formation of the coating film of the organic layer including the light-emitting layer on the auxiliary electrode, particularly, on the edge portion of the pattern, is not sufficient, short occurs between negative electrodes to be formed on the organic layer so that the electric current is concentrated on this portion, and thus a problem arises in which light emission may not be achieved in some cases.

For this reason, attempts have been made in which a problematic portion is covered with an insulating coating film. However, since the auxiliary electrode or the like as described above blocks light from the light-emitting layer, light emission from the transparent electrode substrate surface is not entire surface light emission, and the light emission looks like a black (non-light-emitting) stripe shape or mesh shape corresponding to the shape of the pattern of the auxiliary wiring or the shape of the insulating pattern.

Therefore, from the viewpoint of enhancing the light extraction efficiency, there is also a demand that the entire surface of the light-emitting surface emits uniformly light when the auxiliary electrode or the like is provided in order to obtain surface light emission at a large area.

SUMMARY OF THE INVENTION

The present invention is made in order to solve the above-mentioned technical problems, and an object thereof is to provide an organic EL lighting device which can be seen that the entire surface is uniformly illuminated from the side of a transparent electrode substrate even when an auxiliary electrode or an auxiliary wiring is provided with respect to the transparent electrode substrate.

An organic electroluminescent lighting device according to the present invention includes: a pair of electrode layers including a translucent electrode layer provided on a translucent substrate; at least one organic layer interposed between the pair of electrode layers and including a light-emitting layer; and an auxiliary electrode provided on the translucent electrode layer such that the auxiliary electrode comes in contact with a portion of the translucent electrode layer, wherein the auxiliary electrode includes conductive metal particles having a particle diameter of 0.1 to 2 μm, and is covered with an interlayer insulating coating film for suppressing the conduction with the organic layer.

The auxiliary electrode described herein broadly includes an auxiliary wiring.

According to such an auxiliary electrode, the pattern of the auxiliary electrode becomes less remarkable by particle scattering of light, and also the light extraction efficiency is enhanced.

It is preferable that the conductive metal particles be composed of any of gold, silver, copper, aluminum, nickel, and alloys thereof.

Furthermore, it is preferable that the interlayer insulating coating film contain a polymer and transparent insulating particles having a particle diameter of 0.1 to 2 μm which have a different refractive index from the polymer.

According to such an interlayer insulating coating film, the pattern of the auxiliary electrode can become less remarkable.

It is preferable that the transparent insulating particles be composed of any of titanium oxide, silicon oxide, and barium sulfate.

It is preferable that the auxiliary electrode and the interlayer insulating coating film be formed by screen printing, gravure offset printing, or ink-jet printing.

According to such a Printing scheme, even in the case of a fine pattern shape, it is possible to form the auxiliary electrode and the interlayer insulating coating film accurately and efficiently.

In particular, in order to obtain a fine auxiliary electrode, it is preferable that the auxiliary electrode be formed by gravure offset printing.

It is preferable that a line width of the auxiliary electrode be 1 to 200 μm, and a film thickness of the auxiliary electrode be 0.1 to 10 μm.

According to the present invention, there is provided an organic EL lighting device which can be seen that the entire surface is uniformly illuminated from the side of a transparent electrode substrate even when an auxiliary electrode or an auxiliary wiring is provided with respect to the transparent electrode substrate.

Therefore, according to the organic EL lighting device of the present invention, the light extraction efficiency from the side of the transparent electrode substrate provided with the auxiliary electrode and the like is enhanced, and it is possible to effectively achieve surface light emission with a large area.

BRIEF DESCRIPTION OF THE DRAWINGS

FIG. 1 is a cross-sectional view illustrating an outline of a configuration example of an organic EL lighting device according to an embodiment of the present invention.

DESCRIPTION OF THE EMBODIMENTS

Hereinafter, the present invention will be described in detail.

FIG. 1 illustrates an outline of a configuration example of an organic EL lighting device according to an embodiment of the present invention. As illustrated in FIG. 1, the organic EL lighting device includes a pair of electrode layers 2 and 6 including a translucent electrode layer 2 provided on a translucent substrate 1, at least one organic layer 5 interposed between the pair of electrode layers 2 and 6 and including a light-emitting layer, and an auxiliary electrode 3 provided on the translucent electrode layer 2 such that the auxiliary electrode comes in contact with a portion of the translucent electrode layer. Further, the auxiliary electrode 3 is characterized by including conductive metal particles having a particle diameter of 0.1 to 2 μm, and being covered with an interlayer insulating coating film 4 for suppressing the conduction with the organic layer 5.

Incidentally, the particle diameter or the average particle diameter described in the present invention indicates a median diameter (D50), and can be measured by, for example, a laser diffraction/scattering method.

As described above, when the auxiliary electrode 3 is configured to include conductive metal particles having a particle diameter of 0.1 to 2 μm, light trapped by the total reflection of the translucent substrate 1 among light beams emitted from the light-emitting layer is extracted by particle scattering, and thus a pattern of the auxiliary electrode becomes less remarkable and also the light extraction efficiency is enhanced. Furthermore, a problem that it is not possible to achieve light emission due to short caused by the auxiliary electrode is also improved.

The material of the conductive particles is preferably gold, silver, copper, aluminum or nickel, or a mixture or an alloy of any of them. In particular, silver particles are preferred from the viewpoint that conductivity as the auxiliary wiring is easily obtained at low temperature.

Furthermore, in addition to the metals described above, other metal such as palladium, platinum, zinc, tin, lead, chromium, tungsten, or molybdenum may be further included.

Examples of gold particles include TA-2 (manufactured by TOKURIKI CHEMICAL RESEARCH CO., LTD., average particle diameter of 0.3 to 0.6 μm), TAU-100 (manufactured by the same manufacturer as described above, average particle diameter of 1 μm), G-200 (manufactured by DAIKEN CHEMICAL CO., LTD., average particle diameter of 0.5 μm), G-210 (manufactured by the same manufacturer as described above, average particle diameter of 0.8 μm), and G-400 (manufactured by the same manufacturer as described above, average particle diameter of 1.8 μm).

Examples of silver particles include AY-6080 (manufactured by Tanaka Kikinzoku Kogyo, average particle diameter of 0.2 to 1.0 μm), YMS-61 (manufactured by Yamamoto Precious Metal Co., Ltd., average particle diameter of 0.9 μm), YMS-23 (manufactured by the same manufacturer as described above, average particle diameter of 1.4 μm), YSP-01 (manufactured by the same manufacturer as described above, average particle diameter of 1.7 μm), YSP-02 (manufactured by the same manufacturer as described above, average particle diameter of 1.8 μm), YSP-07 (manufactured by the same manufacturer as described above, average particle diameter of 1.3 μm), SPQ03S (manufactured by MITSUI MINING & SMELTING CO., LTD., average particle diameter of 0.5 μm), EHD (manufactured by the same manufacturer as described above, average particle diameter of 0.5 μm), AG2-1 (manufactured by DOWA Electronics Materials Co., Ltd., average particle diameter of 1.3 μm), AG2-1C (manufactured by the same manufacturer as described above, average particle diameter of 0.8 μm), Silvest C-34 (manufactured by TOKURIKI CHEMICAL RESEARCH CO., LTD., average particle diameter of 0.35 μm), and Silvest AgS-050 (manufactured by the same manufacturer as described above, average particle diameter of 1.4 μm).

Examples of copper particles include Cu1030Y (manufactured by MITSUI MINING & SMELTING CO., LTD., average particle diameter of 0.52 μm), Cu1050Y (manufactured by the same manufacturer as described above, average particle diameter of 0.75 μm), Cu1100Y (manufactured by the same manufacturer as described above, average particle diameter of 1.2 μm), MA-C015K (manufactured by the same manufacturer as described above, average particle diameter of 1.5 μm), MA-C02K (manufactured by the same manufacturer as described above, average particle diameter of 1.8 μm), and HXR-Cu (manufactured by Nippon Atomized Metal Powders Corporation, average particle diameter of 1.0 μm).

Examples of aluminum particles include TFH-A02P (manufactured by Toyo Aluminium K.K., average particle diameter 2 μm) and JTF5# (manufactured by Hunan Goldsky Aluminum Industry High-tech Co., Ltd., average particle diameter of 1 to 2 μm).

Examples of nickel particles include Ultra-Fine Nickel Powder 300 Nano Product (manufactured by Toho Titanium Co., Ltd., average particle diameter of 0.3 μm) and 400 Nano Product (manufactured by the same manufacturer as described above, average particle diameter of 0.4 μm).

Furthermore, the particle diameter of the conductive particles is set to 0.1 to 2 μm, from the viewpoint of increasing light to be extracted outside.

When the particle diameter is less than 0.1 μm, the particle diameter is extremely smaller than the wavelength of light and thus light may not be sufficiently scattered in some cases. On the other hand, when the particle diameter is more than 2 μm, the contact between particles becomes smaller and thus a resistance increases. Moreover, a portion, which is not covered with an insulating pattern generated by the interlayer insulating coating film 4, is easily generated, which may cause short in some cases.

The particle diameter is preferably 0.2 to 1.5 μm.

The auxiliary electrode including the conductive particles as described above can be suitably formed by screen printing, gravure offset printing, or ink-jet printing.

According to such a printing scheme, even in the case of a fine pattern shape, it is possible to form the auxiliary electrode accurately and efficiently.

From the viewpoint that the auxiliary electrode can be formed in a thin film shape, gravure offset printing or ink-jet printing is more preferred, and in order to obtain a fine and thin auxiliary electrode, gravure offset printing is particularly preferred.

As a printing ink for forming the auxiliary electrode, for example, conductive inks described in JP 2014-34589 A, JP 2012-38615 A, JP 2012-38614 A, WO 2014/119463 A, and the like can be used.

The conductive ink preferably contains a resin in order to secure printability and a physical property of a printed pattern, in addition to the conductive particles. Examples of the resin include acrylic resins, methacrylic resins, polystyrenes, polyesters, urethane resins, epoxy resins, phenolic resins, polyvinylphenols, melamine resins, urea resins, vinyl chloride resins, vinyl acetate resins, acetal resins, butyral resins, polyvinyl alcohols, blocked isocyanate resins, fluorine resins, silicon resins, polyimides, and copolymer resins thereof, and these can be used alone or in combination of two or more kinds thereof.

The resin to be contained in the conductive ink is preferably 0.1 to 20% by weight with respect to the conductive particles.

More preferably, a thermosetting resin composition described below is used. The thermosetting resin composition includes a combination of a base agent, which is not cured when being used only, and a curing agent, and those which do not react at normal temperature even when a base agent and a curing agent are mixed and are not cured until heating is performed are selected.

As the base agent, a thermoplastic resin itself having film-forming properties is in heavy usage, from the viewpoint that a high-resolution conductive pattern is easily obtained.

Examples of the thermosetting resin composition include a combination of an epoxy compound as a base agent with acid anhydride, amine, phenolic resin, or the like as an epoxy resin curing agent, and a combination of a film-forming thermoplastic resin having a hydroxyl group, such as a vinyl chloride-vinyl acetate resin having a hydroxyl group, a polyester resin having a hydroxyl group, or an acrylic resin having a hydroxyl group, as a base agent with blocked polyisocyanate or the like as an isocyanate curing agent.

The base agents and the curing agents may be used alone or in combination of two or more kinds thereof.

The line width of the auxiliary electrode is preferably 1 to 200 µm.

When the line width is less than 1 µm, sufficient conductivity as the auxiliary electrode may not be obtained in some cases. On the other hand, when the line width is more than 200 µm, the auxiliary electrode may become easily remarkable and also an area of the light-emitting surface may be decreased in some cases.

The line width is more preferably 1 to 60 µm and particularly preferably 1 to 30 µm.

Furthermore, the film thickness of the auxiliary electrode is preferably 0.1 to 10 µm, from the viewpoint of sufficient conductivity and the viewpoint that an organic layer formed by a multi-layered thin film is stacked on the auxiliary electrode without any defect. More preferably, the film thickness is 0.2 to 4 µm.

Furthermore, it is preferable that the interlayer insulating coating film 4 with which the auxiliary electrode 3 is covered contains a polymer and transparent insulating particles having a particle diameter of 0.1 to 2 µm which have a different refractive index from the polymer.

With the configuration in which the interlayer insulating coating film contains such transparent insulating particles, the pattern of the auxiliary electrode becomes less remarkable by a scattering effect of light due to the transparent insulating particles, and also the light extraction efficiency can be further enhanced.

Examples of the material of the polymer configuring the interlayer insulating coating film include acrylic resins, methacrylic resins, polystyrenes, polyesters, urethane resins, epoxy resins, phenolic resins, polyvinylphenols, melamine resins, urea resins, vinyl chloride resins, vinyl acetate resins, acetal resins, butyral resins, polyvinyl alcohols, blocked isocyanate resins, fluorine resins, silicon resins, polyimides, and copolymer resins thereof, and these can be used alone or in combination of two or more kinds thereof.

Among them, an epoxy resin (refractive index of about 1.6) is preferred, and more preferably, an epoxy resin or a resin formed by polyvinylphenol, a cross-linking agent, a cross-linking aid, or the like which is used in an ink for forming an insulating film described in JP 2010-265423 A, JP 2009-256414 A, and WO 2009/150972 A is used.

As the epoxy resin, any well-known epoxy resins having a di- or higher functional reactive epoxy group may be used and there is no particular limitation. Examples of the epoxy resin include bisphenol A type epoxy resin, bisphenol F type epoxy resin, polyfunctional epoxy resin, flexible epoxy resin, brominated epoxy resin, glycidyl ester type epoxy resin, high-molecular epoxy resin, and biphenyl type epoxy resin, and these may be used alone or in combination of two or more kinds thereof.

More preferably, a solid polyfunctional modified epoxy resin, which is a solid at normal temperature and has an epoxy group even in a moiety other than a molecular long-chain terminal, is used. Examples thereof include fluorene-based epoxy resin, cyclopentadiene type epoxy resin, phenol novolac type epoxy resin, cresol novolac type epoxy resin, halogenated phenol novolac type epoxy resin, alkylphenol novolac type epoxy resin, special novolak type epoxy resin, tetrafunctional alicyclic epoxy resin, and epoxidized polybutadiene, but there is no particular limitation. These resins may be used alone or in combination of two or more kinds thereof.

The content of the solid polyfunctional modified epoxy resin contained in the ink for forming an insulating film is preferably 30% by mass or more and more preferably 50% by mass or more in the total solid content.

As commercialized products thereof, JER154, 157570, 1031S, and 1032H60 (all manufactured by Japan Epoxy Resin Co., Ltd.), On Court EX series (manufactured by NAGASE & CO., LTD.), Epiclon N740, N770-70M, N865, N600 series, HP7200 series, 5100, 5500, and 5800 (manufactured by DIC Corporation), and the like are suitably used.

Furthermore, examples of the cross-linking agent used in the ink for forming an insulating film include acid anhydrides, amine-based compounds, phenol-based compounds, polyamide resins, imidazoles, and polymercaptan-based compounds. In addition, any well-known curing agents may be used, and these agents may be alone or in combination of two or more kinds thereof.

As the phenol-based compounds, polyvinylphenol-based resins are suitably used, and examples thereof include p-vinylphenol homopolymers, copolymers of p-vinylphenol with other vinyl monomers (for example, methyl methacrylate, 2-hydroxyethyl methacrylate, styrene, butyl acrylate, 2-hydroxylethyl acrylate, phenylmaleimide, maleic acid, and fumaric acid), bromine-substituted p-vinylphenol homopolymers, copolymers of bromine-substituted p-vinylphenol with other vinyl resins, homopolymers of p-vinylphenol derivatives obtained by sulfonating, t-butylating, or aminating p-vinylphenol, and copolymers of p-vinylphenol derivatives with other vinyl monomers, but there is no particular limitation. These resins may be used alone or in combination of two or more kinds thereof.

The content of the polyvinylphenol-based resin is preferably 5% by mass or more and more preferably 10% by mass or more in the total solid content of the ink composition for forming an insulating film excluding an extender pigment.

Furthermore, examples of the cross-linking aid include amine-based compounds, polyamides, imidazoles, polymercaptans, boron trifluorides, dicyandiamides, organic acid hydrazides, and triphenylphosphine. In addition, any well-known cross-linking aids may be used and these cross-linking aids may be used alone or in combination of two or more kinds thereof. From the viewpoint of stability at room temperature and low-temperature curing at 150° C. or lower, 2-ethyl-4-methylimidazole is preferred.

The content of the cross-linking aid is preferably 0.3 to 10% by mass and more preferably 1 to 5% by mass in the total solid content. If the content of the cross-linking aid is too small, curing may be insufficient. If the content thereof is too large, the cross-linking aid may remain in the insulating coating film in some cases.

A surface energy adjusting agent, a surfactant, a leveling agent, a releasing agent, a silane coupling agent, or the like may be appropriately added to the ink for forming an insulating film, as necessary.

Furthermore, regarding the transparent insulating particles, transparent insulating particles having a different refractive index from the polymer are used. For example, inorganic particles such as titanium oxide ($TiO_2$) (refractive index of 2.72 (rutile), 2.52 (anatase)), silicon oxide ($SiO_2$) (refractive index of 1.45), barium sulfate (refractive index of 1.64), zinc oxide (refractive index of 2.0), alumina (refractive index of 1.76), zirconium oxide (refractive index of 2.4), calcium carbonate (refractive index of 1.58), calcium sulfate (refractive index of 1.59), magnesium oxide (refractive index of 1.72), lithopone (being one of white pigments and a mixture of barium sulfate and zinc oxide), talc (refractive index of 1.57), kaolin clay (refractive index of 1.56), and synthetic smectite; organic particles such as polyacrylic particles and polyacrylic urethane particles; inorganic-organic hybrid material particles; or the like is suitably used.

Among these, titanium oxide, silicon oxide, and barium sulfate are preferred, titanium oxide and barium sulfate are more preferred, and rutile type titanium oxide is particularly preferred.

As the difference in refractive index between the transparent insulating particles and the polymer configuring the interlayer insulating coating film increases, the degree of light scattering increases. For this reason, the refractive index of the transparent insulating particles is preferably more than 1.6 from the viewpoint that light scattering easily occurs. The refractive index is more preferably 1.7 or more, and particularly preferably 2.0 or more.

The particle diameter of the transparent insulating particles is set to 0.1 to 2 μm.

When the particle diameter is less than 0.1 μm, the particle diameter is extremely smaller than the wavelength of light and thus light may not be sufficiently scattered in some cases. On the other hand, when the particle diameter is more than 2 μm, in some cases, it may be difficult to form the interlayer insulating coating film in a thin film shape.

The particle diameter is preferably 0.2 to 1.5 μm.

The shape of the particles may be a granular shape, a plate shape, or a needle shape.

The interlayer insulating coating film 4 including the transparent insulating particles as described above can also be formed suitably by screen printing, gravure offset printing, or ink-jet printing.

According to such a printing scheme, even in the case of a fine pattern shape, it is possible to form the interlayer insulating coating film 4 accurately and efficiently such that the auxiliary electrode 3 is covered with the interlayer insulating coating film 4.

The translucent substrate 1 is configured by glass, ceramic, a resin, and the like which have translucency. A flexible organic EL lighting device can also be manufactured by using a resin.

The translucent electrode layer 2 formed on the translucent substrate 1 may be a positive electrode or a negative electrode, and is preferably formed by a material having a high light transmission rate. For example, the translucent electrode layer can be formed as a positive electrode of indium tin oxide (ITO), indium zinc oxide (IZO), or the like.

The organic layer 5 is formed on the translucent electrode layer 2 and the interlayer insulating coating film 4. The organic layer 5 includes a light-emitting layer and the structure of a well-known organic EL element can be employed. That is, a structure in which a hole transport layer, an electron transport layer, a hole injection layer, an electron injection layer, and the like are stacked in addition to the light-emitting layer can be employed.

The constituent material of each layer is not particularly limited, a well-known material can be appropriately selected and used, and any of low-molecular and high-molecular materials may be used.

Hereinafter, examples of the constituent material of each layer are described.

The light-emitting material used in the light-emitting layer contributes directly or indirectly to light emission using a hole or an electron, and emits light by fluorescence and/or phosphorescence.

The light-emitting layer generally includes a host material having a function of transporting a hole and an electron injected to the light-emitting layer and a dopant material having a function of emitting light by using energy obtained by recombining the transported hole and electron. The light-emitting material may include a host material and a dopant material.

Examples of a high-molecular host material among host materials include poly(9-vinylcarbazole) (PVK), polyfluorene (PF), polyphenylene vinylene (PPV) and a copolymer including monomer units thereof.

Examples of a low-molecular host material include 4,4'-bis(9H-carbazol-9-yl)biphenyl (CBP), bis(2-methyl-8-quinolinolate)-4-(phenylphenolato)aluminum (BAlq), tris(8-quinolylato)aluminum ($Alq_3$), and 9,9'-(p-tert-butylphenyl)-1,3-biscarbazole.

Examples of a high-molecular dopant material among dopant materials include polyphenylene vinylene (PPV), cyano-polyphenylene vinylene (CN-PPV), poly(fluorenylene ethynylene) (PFE), polyfluorene (PFO), a polythiophene polymer, polypyridine, and a copolymer including monomer units thereof.

Examples of a low-molecular dopant material include fluorescent light-emitting materials and phosphorescent light-emitting materials.

Examples of the fluorescent light-emitting materials include naphthalene, perylene, pyrene, chrysene, anthracene, coumarin, p-bis(2-phenylethenyl)benzene, quinacridone, an aluminum complex such as $Al(C_9H_6NO)_3$, rubrene, perimidone, dicyanomethylene-2-methyl-6-(p-dimethylaminostyryl)-4H-pyran (DCM), benzopyran, rhodamine, benzothioxanthene, azabenzothioxanthene, and derivatives thereof.

Examples of the phosphorescent light-emitting materials include tris(2-phenylpyridine)iridium ($Ir(ppy)_3$), tris(2-phenylpyridine)ruthenium, tris(2-phenylpyridine)palladium, bis(2-phenylpyridine)platinum, tris(2-phenylpyridine)osmium, tris(2-phenylpyridine)rhenium, tris[2-(p-tolyl)pyridine]iridium ($Ir(mppy)_3$), tris[2-(p-tolyl)pyridine]ruthenium, tris[2-(p-tolyl)pyridine]palladium, tris[2-(p-tolyl)pyridine]platinum, tris[2-(p-tolyl)pyridine]osmium, tris[2-(p-tolyl)pyridine]rhenium, platinum octaethylporphyrin, platinum octaphenylporphyrin, palladium octaethylporphyrin, and palladium octaphenylporphyrin.

Furthermore, examples of a material used for the hole injection layer include a phthalocyanine buffer layer of copper phthalocyanine or the like; an oxide buffer layer of vanadium oxide or the like; an amorphous carbon buffer layer; and a high-molecular buffer layer of polyaniline (emeraldine), poly(3,4-ethylenedioxythiophene)-poly(styrene sulfonate) (PEDOT-PSS), or the like.

Examples of a material used for the hole transport layer include low-molecular triphenylamine derivatives such as TPD (N,N'-diphenyl-N,N'-di(3-methylphenyl)-1,1'-biphenyl-4,4'diamine), α-NPD (4,4'-bis[N-(1-naphthyl)-N-phenylamino]biphenyl), and m-MTDATA (4,4',4''-tris(3-methylphenylphenylamino)triphenylamine); polyvinyl carbazole; and high-molecular compounds obtainable by introducing a polymerizable substituent to a triphenylamine derivative and performing polymerization.

Examples of a material used for the electron transport layer include metal complexes having a quinoline skeleton or a benzoquinoline skeleton such as $Alq_3$, tris(4-methyl-8-quinolinolato)aluminum ($Almq_3$), bis(10-hydroxybenzo[h]quinolinato)berylium ($BeBq_2$), BAlq, and bis(8-quinolinolato)zinc (Znq); metal complexes having a benzoxazoline skeleton such as bis[2-(2'-hydroxyphenyl)benzoxazolato] zinc ($Zn(BOX)_2$); metal complexes having a benzothiazoline skeleton such as bis[2-(2'-hydroxyphenyl)benzothiazolato]zinc ($Zn(BTZ)_2$); polyazole derivatives such as 2-(4-biphenylyl)-5-(4-tert-butylphenyl)-1,3,4-oxadiazole (PBD), 3-(4-biphenylyl)-4-phenyl-5-(4-tert-butylphenyl)-1,2,4-triazole (TAZ), 1,3-bis[5-(p-tert-butylphenyl)-1,3,4-oxadiazole-2-yl]benzene (OXD-7), 9-[4-(5-phenyl-1,3,4-oxadiazole-2-yl)phenyl]carbazole (CO11), 2,2',2''-(1,3,5-benzenetriyl)tris(1-phenyl-1H-benzimidazole) (TPBI), and 2-[3-(dibenzothiophene-4-yl)phenyl]-1-phenyl-1H-benzimidazole (mDBTBIm-II); benzimidazole derivatives; quinoline derivatives; perylene derivatives; pyridine derivatives; pyrimidine derivatives; quinoxaline derivatives; diphenylquinone derivatives; and nitro-substituted fluorene derivatives.

Examples of a material used for the electron injection layer include a metal buffer layer of strontium, aluminum, or the like; an alkali metal compound buffer layer of lithium fluoride or the like; an alkaline-earth metal compound buffer layer of magnesium fluoride or the like; and an oxide buffer layer of aluminum oxide or the like.

The film thickness of each constituent layer of the organic layer 5 is decided appropriately according to circumstances in consideration of adaptivity between respective layers, the total layer thickness to be demanded, and the like. In general, each layer is formed to have a film thickness in the range of 0.5 nm to 5 μm.

Furthermore, an emission spectrum obtained by the organic layer is not particularly limited, but, for example, may be any color of blue, green, red, white, and the like.

The electrode layer 6 is formed on the organic layer 5 to face the translucent electrode layer 2. When the electrode layer 6 is not a light-emitting surface, it is not necessary that the electrode layer 6 be a translucent electrode layer, and any well-known materials and configurations may be employed, and there is no particular limitation. For example, in the case of a negative electrode, in general, the electrode layer is configured by a metal having a small work function (4 eV or less) such as Al, an alloy thereof, or a conductive compound.

The method for forming each layer described above may be a dry process such as a vapor-deposition method or a sputtering method. If any methods can be employed, when a wet process, such as a spin coating method, an ink-jet method, a casting method, a dip coating method, a bar coating method, a blade coating method, a roll coating method, a gravure coating method, a flexographic printing method, a spray coating method, or a method of utilizing a nanoparticle dispersion, is employed, it is possible to stack layers more simply and efficiently, which is favorable.

EXAMPLES

Hereinafter, the present invention will be described in more detail based on Examples. However, the present invention is not intended to be limited to the following Examples.

Example 1

An organic EL lighting device (panel) having a configuration as illustrated in FIG. 1 was manufactured as follows.

A glass substrate was used as the translucent substrate 1, an ITO film was then formed, as the translucent electrode layer 2, on the glass substrate, and patterning was performed by photolithography, thereby forming a transparent electrode pattern.

Further, a silver ink obtained by dispersing silver particles having a particle diameter of 0.8 μm in an epoxy resin was printed on the substrate by a gravure offset scheme, thereby forming the auxiliary electrode 3. A printing plate having a depth of 10 μm and a line width of 50 μm was used.

An insulating ink (refractive index of about 1.6) comprised of an epoxy resin containing a phenolic resin as a curing agent was subjected to screen printing such that the insulating ink covered the contact portion between the auxiliary electrode 3 and the translucent electrode layer (ITO) 2 (that is, covered the circumference of the auxiliary electrode 3) to thereby form the interlayer insulating coating film 4, and then the interlayer insulating coating film 4 was calcined at 180° C.

The film thickness of the auxiliary electrode 3 after calcination was 3.5 μm, and the total film thickness of the auxiliary electrode 3 and the interlayer insulating coating film 4 was 6.5 μm.

On the interlayer insulating coating film 4, a hole transport layer configuring the organic layer 5, an organic light-emitting layer obtained by using an aluminum quinolinol complex, and further an aluminum electrode layer (negative electrode) 6 were formed by vapor deposition, and then sealed, thereby manufacturing an organic EL lighting panel emitting green light.

When the luminance of the manufactured panel from the side of the substrate surface was measured by CS-2500 (manufactured by Konica Minolta, Inc.), the luminance of the portion of the auxiliary electrode was ⅔ of the light-emitting portion on ITO.

Example 2

An organic EL lighting panel was manufactured in the same manner as in Example 1, except that 1% by weight of titanium oxide particles having a particle diameter of 0.25 μm was added to the insulating ink in Example 1, and the luminance measurement was performed.

The luminance of the portion of the auxiliary electrode was ⅔ of the light-emitting portion on ITO, and the luminance of the portion of the interlayer insulating coating film was ⅖ of the light-emitting portion on ITO.

Comparative Example 1

An organic EL lighting panel was manufactured in the same manner as in Example 1, except that a silver nano ink containing no silver particles was printed by an ink-jet scheme to form an auxiliary electrode in Example 1, and the luminance measurement was performed.

The portion of the auxiliary electrode was black and was in a state where the luminance thereof could almost not be observed as compared to the portion on ITO.

What is claimed is:

1. An organic electroluminescent lighting device comprising:
    a pair of electrode layers including a translucent electrode layer provided on a translucent substrate; and
    at least one organic layer and an auxiliary electrode interposed between the pair of electrode layers, wherein
    the at least one organic layer includes a light-emitting layer,
    the auxiliary electrode is provided on the translucent electrode layer such that the auxiliary electrode comes in contact with a portion of the translucent electrode layer, includes conductive metal particles having a particle diameter of 0.1 to 2 μm, and is covered with an interlayer insulating coating film for suppressing the conduction with the organic layer, and
    the interlayer insulating coating film contains a polymer and transparent insulating particles having a particle diameter of 0.1 to 2 μm which have a different refractive index from the polymer.

2. The organic electroluminescent lighting device according to claim 1, wherein the conductive metal particles are composed of any of gold, silver, copper, aluminum, nickel, and alloys thereof.

3. The organic electroluminescent lighting device according to claim 1, wherein the transparent insulating particles are composed of any of titanium oxide, silicon oxide, and barium sulfate.

4. The organic electroluminescent lighting device according to claim 1, wherein the auxiliary electrode and the interlayer insulating coating film are formed by screen printing, gravure offset printing, or ink-jet printing.

5. The organic electroluminescent lighting device according to claim 1, wherein a line width of the auxiliary electrode is 1 to 200 μm.

6. The organic electroluminescent lighting device according to claim 1, wherein a film thickness of the auxiliary electrode is 0.1 to 10 μm.

* * * * *